United States Patent [19]

Klughart

[11] Patent Number: 5,543,761
[45] Date of Patent: Aug. 6, 1996

[54] PREPACKAGED CRYSTAL OSCILLATOR CALIBRATION AND CONFIGURATION INTERFACE

[75] Inventor: Kevin M. Klughart, Addison, Tex.

[73] Assignee: Dallas Semiconductor Corp, Dallas, Tex.

[21] Appl. No.: 518,938

[22] Filed: Aug. 24, 1995

[51] Int. Cl.[6] .............................. H03B 5/04; H03B 5/36; H03L 1/02

[52] U.S. Cl. ................ 331/44; 331/66; 331/68; 331/108 C; 331/158; 331/179

[58] Field of Search ..................... 331/44, 66, 68, 331/69, 108 C, 116 FE, 158, 176, 179

[56] References Cited

U.S. PATENT DOCUMENTS

5,446,420  8/1995  Westwick .............................. 331/44 X

*Primary Examiner*—David Mis
*Attorney, Agent, or Firm*—Jenkens & Gilchrist

[57] ABSTRACT

A communication system providing read and write access to analog and digitally controlled calibration and configuration information contained within prepackaged crystal oscillators having a crystal oscillator electrical interface with power (VCC), ground (GND), output enable (OE), and oscillator output (XO) interface pins. An output enable (OE) signal is used to control the activity state of the crystal oscillator output, with a pullup MOSFET connected to the XO pin to detect a logic low level at the XO pin during times when the OE signal is logically inactive. A state machine controls access to a serial shift register having multiple calibration and configuration bits. The calibration and configuration bits are used in performing an oscillator specific calibration and configuration function. The state machine also controls the reads and writes of the calibration and configuration shift register. An analog buffer is used to drive the XO line with an internal analog test point voltage of the crystal oscillator.

37 Claims, 4 Drawing Sheets

PREPACKAGED CRYSTAL OSCILLATOR CALIBRATION AND CONFIGURATION INTERFACE

PARTIAL WAVER OF COPYRIGHT PROTECTION

A portion of the disclosure of this patent document contains material which is subject to copyright protection. The copyright owner has no objection to the facsimile reproduction by any one of the patent disclosure, as it appears in the United States Patent and Trademark office patent files or records, but otherwise reserves all copyright rights whatsoever.

FIELD OF THE INVENTION

This invention relates generally to the field of prepackaged crystal oscillators, and in particular, to prepackaged crystal oscillators requiring digital and analog calibration and configuration to be performed after the crystal oscillator has been packaged and thermally stressed.

DESCRIPTION OF THE RELATED ART

There are a variety of serial interfaces known within the electronics industry, including a variety of two, three, four, and five-wire communication interfaces. Typical serial interfaces provide for a power connection (VCC), a ground connection (GND), a synchronization signal (RST), a system clock (CLK), transmit data (D), and receive data (Q), Some interfaces eliminate the RST signal and combine the D and Q signals to form an I/O data signal (DQ), thus producing a four-wire system comprising just VCC, GND, CLK, and DQ. In all the systems currently popular within the electronics industry, the CLK signal is used to sample the D or DQ data lines on the rising edge of CLK. Subsequent CLK cycles used in conjunction with a state machine can enable a variety of protocols to be digitally decoded and thus a variety of communication protocols to be established by this simple electrical interface.

In most circumstances the minimum communication interface comprising VCC, GND, CLK and DQ can be incorporated on an integrated circuit by the addition of appropriate connecting pins in conjunction with appropriate digital logic to support the desired interface protocol. Such is not the case in retrofit circumstances in which the hardware interface is already defined as an industry standard. In this instance, there may be less than four interface points available for use as additional pins for serial communication. This is the case with the current state of prepackaged crystal oscillators, which have four pins in their minimum configuration, all pins having a predefined function which makes them at first glance unavailable for use in implementing any communications interface to the prepackaged crystal oscillator.

One alternative to the addition of more electrical interface pins to an existing industry standard crystal oscillator in order to implement a serial communication interface is the use of overvoltage/undervoltage sensing on one or more input pins to place the system in a test mode which supports some form of serial communications. While this technique has been used in the past to provide access to specialized test modes in a variety of integrated circuit designs, it suffers from the drawback that in most cases the voltage required to activate the test mode is on the order of 1.5 times the normal operating VCC supply of the device. The power supply required to generate this test mode voltage is in general available during manufacturing and testing at the factory, but is rarely available once the prepackaged crystal oscillator is installed within a functioning target system. Since one of the goals of this invention is to provide access to a variety of calibration and configuration information in the field use of the prepackaged crystal oscillator, the technique of using overvoltage/undervoltage as a test mode enabling feature must be ruled out as impractical.

BACKGROUND OF THE INVENTION

Prepackaged crystal oscillators are a well known and widely used commodity within the electronics industry. Conventional prepackaged crystal oscillators have as their minimum electrical interface four pins: power (VCC), ground (GND), output enable (OE), and oscillator output (XO). The components comprising an industry standard prepackaged crystal oscillator system include a crystal (to provide the frequency reference), oscillator amplifier (to excite the crystal to resonance), buffer amplifier (to isolate the output load from the oscillator), output limiting resistor (to limit power dissipation in the crystal), trim capacitors (to properly trim the resulting crystal oscillator output frequency), and a package enclosure having a minimum of four interface pins for the VCC, GND, OE, and XO connections. Common package enclosures for prepackaged crystal oscillators include hermetically sealed steel enclosures and a variety of molded epoxy/plastic configurations. By the very nature of the construction process used in industry standard crystal oscillators the calibration and configuration of the oscillator must be performed prior to enclosure or encapsulation.

VCC and GND pins provide power for the oscillator circuitry. The XO pin is driven by an internal crystal oscillator and represents the usable output of the crystal oscillator system. This XO output is usually the output of a digital buffer which isolates the internal crystal oscillator system from the load being driven by the prepackaged crystal oscillator system. The OE pin controls the activity state of the crystal oscillator system. When the OE pin is at VCC potential (logic high level), the oscillator is enabled and the XO pin is driven by the internal crystal oscillator. When the OE pin is at GND potential (logic low level), the oscillator is disabled and the crystal oscillator system is placed in a low power standby mode.

It is widely known and accepted by those skilled in the art that the OE pin can be configured to have a negative logic sense to the one just described, such that OE at VCC potential (logic high level) disables the crystal oscillator operation and OE at GND potential (logic low level) enables the crystal oscillator operation. In this configuration the OE signal is usually renamed to STANDBY (SB) to indicate the logic sense reversal. This variation in logic sense is one of interface convenience and has no fundamental impact on the overall operation of the prepackaged crystal oscillator system other than the fact that an additional digital inverter is necessary to convert the external SB signal with active high sense to an internal OE signal of active high sense. Throughout the remainder of this document the nomenclature logically active and logically inactive will be used to denote the activity state of various signals with the implicit assertion that the signals in question may be implemented with either a positive logic sense in which VCC voltage levels represent a logic 1 (logically active/asserted) and GND voltage levels represent a logic 0 (logically inactive/deasserted), or correspondingly a negative logic sense in which VCC voltage levels represent a logic 0 (logically inactive/deasserted) and GND voltage levels represent a logic 1 (logically active/asserted)

OBJECT OF THE INVENTION

Accordingly, the principal object of the present invention is to provide a general, practical, and predetermined circuit to allow serial communication of calibration and configuration information to prepackaged crystal oscillators.

It is another object of the present invention to allow serial communication of calibration and configuration information to a prepackaged crystal oscillator with an industry-standard VCC, GND, OE, and XO electrical interface, allowing for direct retrofitting of existing industry standard prepackaged crystal oscillators with newly designed crystal oscillators that have been trimmed and calibrated to higher degrees of accuracy than previously available within the industry.

It is yet another object of the present invention to provide increased accuracy in the configuration and calibration of a crystal oscillator via digital calibration trim bits which are set by the manufacturers.

SUMMARY OF THE INVENTION

Industry standard prepackaged crystal oscillators are, in general, trimmed and calibrated during their manufacture prior to encapsulation or enclosure. While this approach has several manufacturing advantages, the accuracy and stability of the resulting crystal oscillator suffers because additional compensation and calibration is usually required after the oscillator module is manufactured in order to achieve a high degree of frequency stability over temperature and operating voltages. Since the manufacturing and encapsulating or enclosure process causes drifts in the operating frequency of the resulting crystal oscillator, there is no reliable method of accurately compensating for these effects prior to manufacture.

An added problem associated with oscillator frequency stability is one of crystal aging which occurs during the lifetime of the oscillator. This effect can be accelerated and to some extent stabilized by exposing the crystal oscillator to elevated temperatures and duty cycles after manufacture (e.g. burn in). Again, this effect can not be compensated for directly before the crystal oscillator is manufactured.

Given that the compensation and calibration of crystal oscillators must be done post-manufacture to achieve high degrees of frequency stability over temperature and operating supply voltages, some of these effects can be compensated for by the use of digital calibration and trimming of the oscillator after manufacture and burn in. This approach also has the ability of being able to compensate for minute variations within the quartz crystals used in the crystal oscillator, as these quartz crystals often vary as much as 30 parts per million (PPM) from their nominal operating frequency.

The present embodiment uses a calibration trim shift register memory element to store digital information which is used by a crystal oscillator module to perform specific calibration and configuration functions. The invention as disclosed makes use of a state machine to interpret a digital protocol presented to an industry standard crystal oscillator pinout. The protocol as disclosed is compatible with the existing operation of industry standard crystal oscillators, but has the added benefit of allowing digital information to be transferred to and from the calibration trim shift register as well as allowing inspection of internal analog voltages present within the crystal oscillator. These features when combined allow minute changes to be made to the basic crystal oscillator system and thus enable the operating frequency of the system to be stabilized over temperature and voltage.

The state machine includes seven states, each state supporting the various modes of operation of the invention. Two states, RESET and RUN, support the conventional operating modes of an industry standard crystal oscillator. The remaining states, RISE, FALL, ARISE, DRISE, and DFALL support access protocol interpretation, analog read, and digital read/write functions.

A portion of the protocol state machine function permits an access protocol to be matched before the calibration trim shift register can be accessed. This feature ensures that the data within this memory element is not inadvertently written during normal system operation.

Initial communication with the present embodiment is via the use of external circuitry which forces a logic low level at the XO pin on the active edge of the OE input signal. This condition will not be present in the normal operating conditions of an industry standard crystal oscillator, so this communication mode represents an upward compatible addition to the industry standard control interface for crystal oscillator systems.

Operational features of the invention will be appreciated by those skilled in the art upon reading the detailed description which follows with reference to the attached drawings.

DESCRIPTION OF THE PRESENTLY PREFERRED EXEMPLARY EMBODIMENTS

PREFERRED SYSTEM CONTEXT OF THE PRESENT INVENTION

In the presently preferred embodiment, the claimed invention is used in the context of a prepackaged crystal oscillator system having a minimum of four interface pins: power (VCC), ground (GND), output enable (OE), and oscillator output (XO). Various features of this system context will therefore be described in detail below. The general features of this context will now be described.

Figure 1:
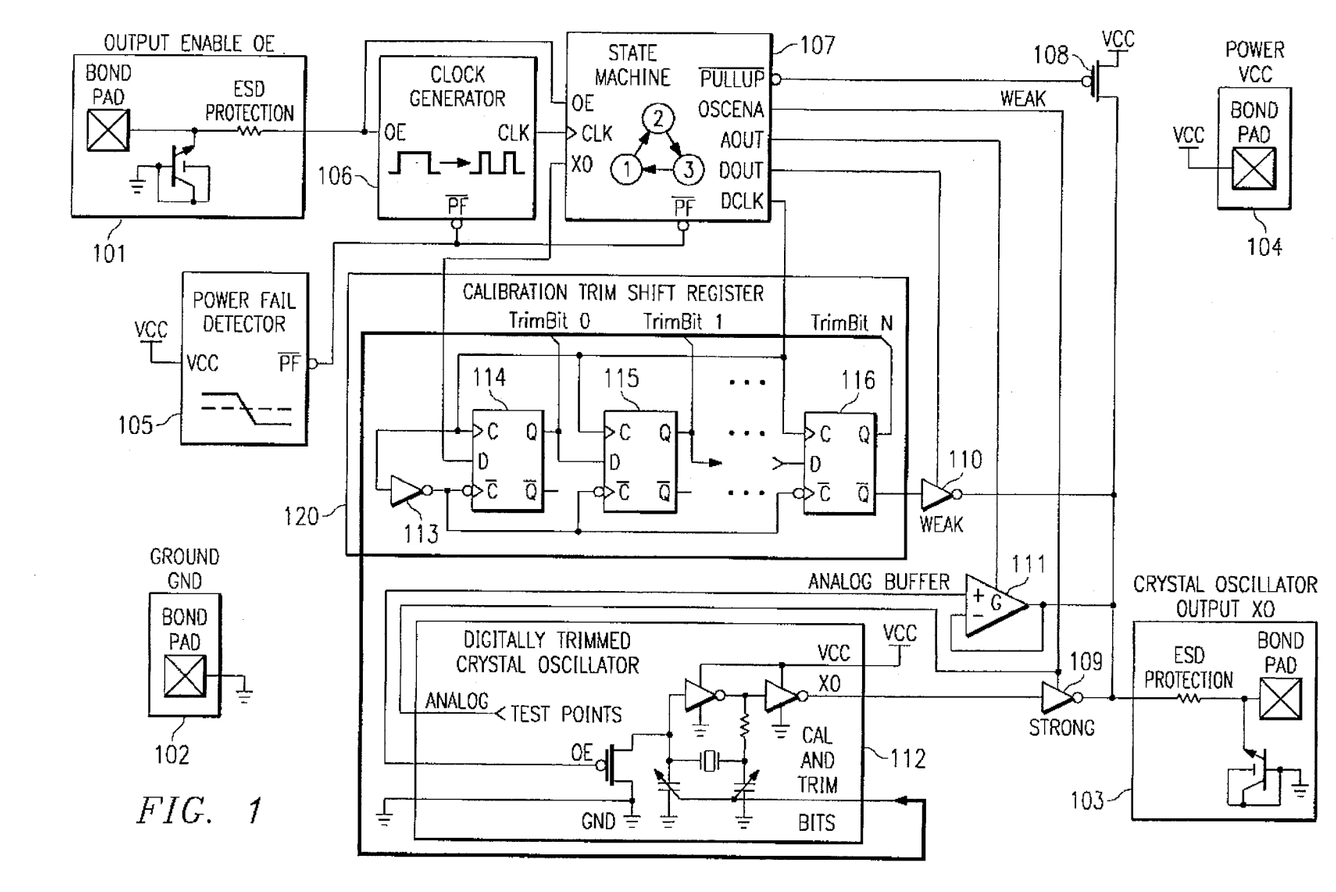
FIG. 1 is a circuit diagram which illustrates the logic required to implement the crystal oscillator serial interface, using an industry standard crystal oscillator block augmented with additional digital calibration and analog output features as the generator of the required XO crystal oscillator output signal.
Figure 2A:
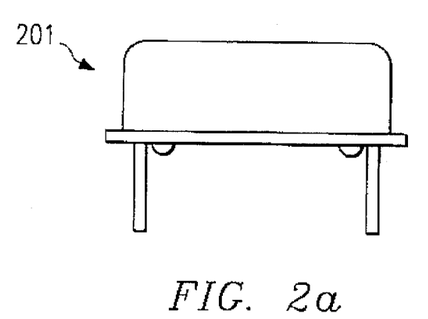
FIGS. 2a, 2b, and 2c illustrate a first package configuration style
Figure 2B:
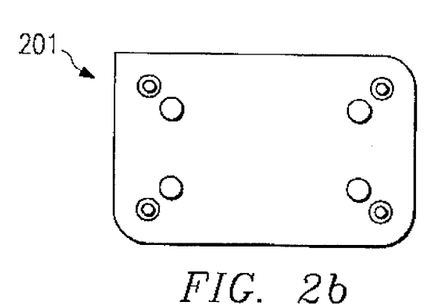
Figure 2C:
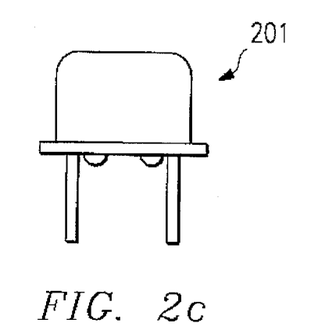
Figure 2D:
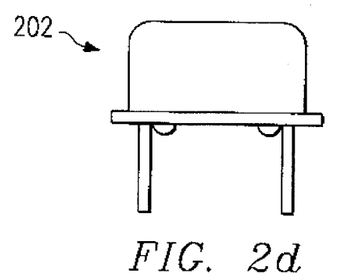
FIGS. 2d, 2e, and 2f illustrate a second package configuration style for prepackaged crystal oscillators according to the teachings of the present invention.
Figure 2E:
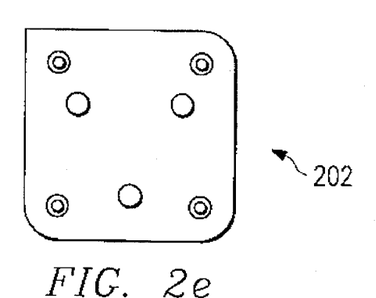
Figure 2F:
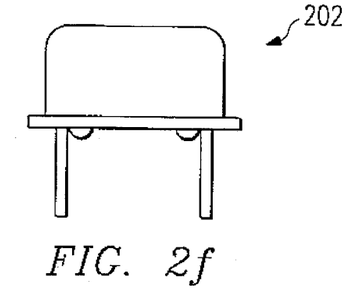

Many of the innovative teachings of the present application will initially be described in the context of an embodiment, as shown in FIG. 1, wherein an existing industry standard crystal oscillator 112 is used as the basis for a more advanced crystal oscillator system having digitally controlled calibration and configuration information 120 as well as the ability to emit internal analog voltages via a switched analog amplifier 111 for use in the crystal oscillator frequency calibration process.

Although N bits are disclosed within the calibration and configuration register 120, it is contemplated to be within the scope of this invention that any number of configuration and calibration bits is capable of being operated on by this invention. Similarly, the ability of this embodiment to emit analog test voltages is not limited, as portions of the calibration and configuration register can be used to select from a plurality of analog voltages which are internal to the digitally trimmed crystal oscillator 112.

The present embodiment maintains compatibility with a standard industry mechanical footprint for crystal oscillators as illustrated in packages 201 and 202 of FIGS. 2a–2f, while at the same time providing a crystal oscillator system which is more accurate and stable over voltage and temperature than models currently available.

One method of achieving this goal is to perform more testing and trimming of the oscillator characteristics in the manufacturing process and as part of the final test procedure for the oscillator system. The present embodiment assumes that this testing and trimming procedure occurs after packaging is completed and thus this fact severely limits access to the internal workings of the crystal oscillator system in order to perform calibration operations. To compensate for this lack of physical access, a method must be devised to enable test mode access to the internal workings of the crystal oscillator system while not violating the industry standard package interface.

As an example of how the present embodiment solves this interface problem, consider the typical manufacturing flow in which a silicon integrated circuit containing a digitally trimmed crystal oscillator is placed on a substrate and subsequently attached to a crystal. During the manufacturing process this system is then encapsulated in a package having connections for VCC, GND, OE, and XO.

The packaged crystal oscillator is then exercised at temperature with the crystal active in order to age the crystal and thus stabilize its frequency once used by the customer.

After the aging process is complete, the prepackaged crystal oscillator is then tested at a number of temperatures to determine how much digital trimming is necessary to compensate for crystal and circuit changes at various ambient temperatures. Once the prepackaged crystal oscillator has been tested at various temperatures it will be possible to generate a calibration curve to compensate the oscillation frequency of the crystal oscillator over temperature.

Once the calibration information has been determined, the digital trim bits can be serially shifted into the encapsulated/encased crystal oscillator using the disclosed serial interface and associated serial protocol. Once this step is complete, the operating characteristics of the crystal oscillator will be stable over a temperature range according to the calibration data stored within the calibration trim shift register 120.

This process produces a finished crystal oscillator system that is physically identical to that of any industry standard prepackaged crystal oscillator, but has much better frequency stability over temperature and operating voltage.

In general, there are many ways to approach the problem of providing better temperature and voltage immunity to crystal oscillators, but this invention seems to make clear the point that a novel design approach is required to solve the problem of providing these improvements while simultaneously living within the industry standard footprint for prepackaged crystal oscillators.

The numerous innovative teachings of the present application will be described with particular reference to the presently preferred embodiment, wherein these innovative teachings are advantageously applied to the particular problems of a crystal oscillator serial interface. However, it should be understood that this embodiment is only one example of the many advantageous uses of the innovative teachings herein. In general, statements made in the specification of the present application do not necessarily limit any of the various claimed inventions. Moreover, some statements may apply to some inventive features but not to others.

I/O Pads And ESD Protection

Referring to FIG. 1, the present embodiment of the invention incorporates all required logic on a single integrated circuit which has VCC 104, GND 102, OE 101, and XO 103 interface bond pads which are used as the electrical interface to the standard prepackage crystal oscillator package. Note that the OE 101 and XO 103 bond pads also incorporate electrostatic discharge (ESD) protection to prevent damage to internal circuitry due to ESD events that occur in package handling and testing.

Power Fail Detector

The power-fail detector circuitry 105 provides an active low signal PF which is activated when the system power supply voltage present on the VCC pin 104 drops below a predetermined threshold. There are a plurality of methods to implement this functionality which range from using inverters with skewed trip thresholds to bandgap references with chopper-stabilized comparators. It is contemplated to be within the scope of this invention that a power fail detector may be generated in many ways depending on the desired robustness of the detection as well as the corresponding tradeoff in implemented circuit complexity and area.

In the preferred embodiment the power fail detector logic is implemented via the use of a weak inversion voltage reference combined with a simple inverter threshold detector, although more elaborate schemes with improved accuracy could be devised to provide the same functionality.

Clock Generator

Figure 3:
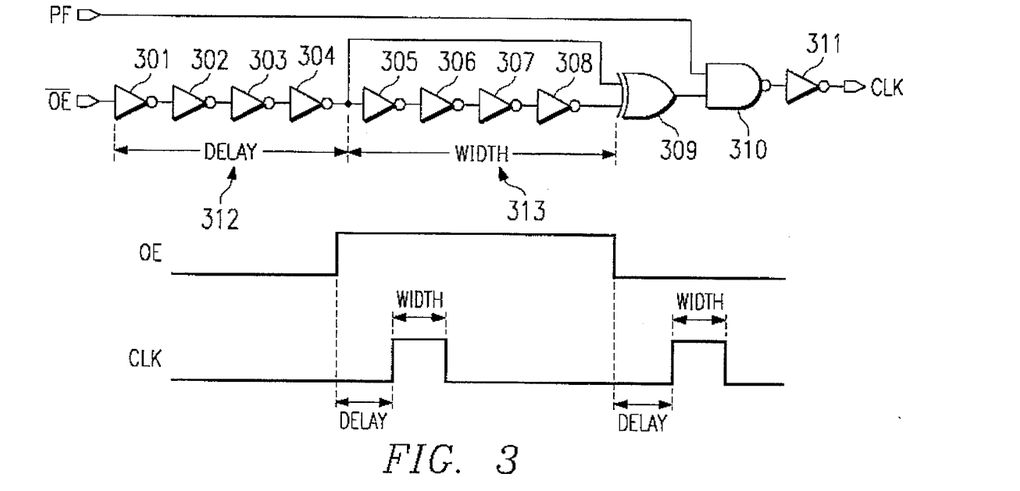
FIG. 3 is a circuit/timing diagram which illustrates the logic required to generate state machine clocks on both rising and falling edges of the OE control signal.

Regarding the clock generator 106, the present embodiment utilizes state machine activity on both rising and falling edges of the OE signal. This is accomplished by the circuit as shown in FIG. 3. A conventional delay chain of inverters (301, 302, 303, 304) is used to generate a delayed version of the OE signal which is suitable for the rising edge of the first state machine clock. It is understood that inverter delay chains may be designed in a number of ways to generate equivalent signal delays.

The purpose of the initial delay in OE is to prevent the circuit from inadvertently entering an invalid state on system power up. Since the purpose of the OE signal is to be backward compatible with existing prepackaged crystal oscillators, the oscillator should be enabled on power up if the OE input is in a logically active state.

Still referring to FIG. 3, inverters 305, 306, 307, and 308 in conjunction with XOR gate 309 produce an active high pulse on the rising and falling edges of the delayed OE signal. The pulse width duration is adjustable by judicious sizing of the inverter chain (305, 306, 307, 308) and need only have sufficient width to guarantee proper clocking of the state machine 107.

NAND gate 310 and inverter 311 combine to force the clock to an inactive state when a power-fail state has been detected by the power fail logic 105. This preventative measure insures that no false protocol clocks enter the state machine during periods in which the system power supply is unstable or unreliable.

Pullup Device

Referring to FIG. 1, a pullup device 108 is present in the current embodiment as a MOSFET transistor and is used to weakly drive the XO output to VCC potential during times that the OE signal is logically inactive. This weak pullup device allows the XO pin to be driven to GND potential during times that the digital protocol is to be in effect for communication with the invention.

It is understood that the use of a pullup MOSFET is a technology-specific implementation of a general resistive pullup device, and in general, the pullup MOSFET could be replaced by any device capable of passing a limited amount of current based on the state of an input gate control voltage or current.

In addition, it is also understood that the current architecture of the invention could be equivalently implemented using a pulldown MOSFET or other current sinking pulldown device, with a subsequent change in the logic sense of all the control logic associated with the XO signal.

Figure 5:
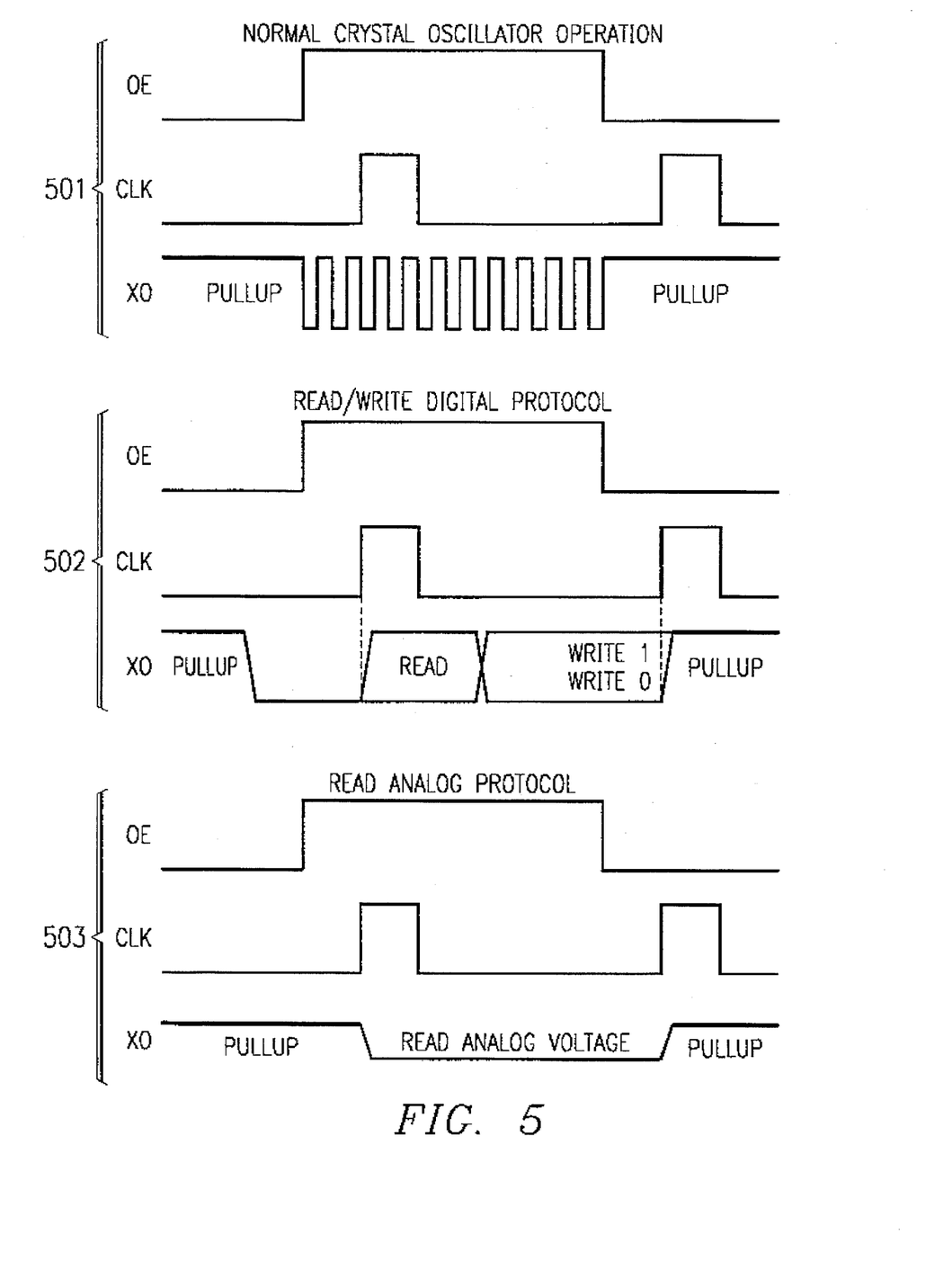
FIG. 5 is a diagram which illustrates the clock and data relationships for the present invention with the three modes of operation (NORMAL, DIGITAL, and ANALOG) supported by the interface illustrated as separate stimulus waveforms.

Referring to FIG. 5, the heavily drawn lines indicate time intervals in which the XO pin is weakly pulled to VCC via the use of MOSFET 108.

Digitally Trimmed Crystal Oscillator

Referring to FIG. 1, the target of the calibration trim shift register data 120 is the digitally trimmed crystal oscillator 112. This oscillator is controlled and configured via the use of a digital bit stream and has the capability of emitting a limited number of internal analog voltages to aid in the oscillator calibration process. The exact implementation of the digitally trimmed crystal oscillator is unimportant; the purpose of the current embodiment is to enable such an oscillator a way for communicating its digital and analog calibration and configuration information to and from the outside environment using an industry standard crystal oscillator electrical interface.

Calibration Trim Shift Register

The calibration trim shift register 120 provides a method of storing calibration and configuration information within the present embodiment. This calibration and configuration information can include oscillator frequency trim information, calibration traceability information, unit serial number identification, date of manufacture, and a wide variety of other information that may pertain to the current and past state of the crystal oscillator.

While the current embodiment implements the shift register using conventional volatile D flip-flops, it is contemplated to be within the scope of this invention that the calibration trim shift register, in general a memory element for the state of the crystal oscillator, could be implemented using non-volatile RAM, EPROM, EEPROM, or any other memory technology capable of storing digital information. An alternative embodiment of the invention uses EEPROM as the memory element for the calibration trim shift register so that calibration information can be permanently saved within the prepackaged crystal oscillator during the calibration phase of the manufacturing test procedure.

The complement clock required for standard D flip-flops used in the present embodiment of the calibration trim shift register is generated by inverter 113. The Q outputs of the D flip-flop chain 440 delimited by 114, 115, and 116 are bussed internally to the digitally trimmed crystal oscillator 112 which in turn uses this digital information to perform oscillator-specific calibration and configuration functions.

Tristate inverter 110 is used to drive the calibration trim shift register data onto the output pin XO during reads of the calibration trim shift register. Enablement of this read function is provided by the state machine 107 output control line DOUT.

State Machine

The control signals used to drive the present embodiment are generated by a finite state machine 107. The state machine 107 takes as its inputs the OE signal obtained from the output enable pad 101, a double-edge clock (CLK) generated from the clock generator 106, and power fail (PF) signal generated by the power fail detector logic 105. The state machine generates an oscillator enable (OSCENA) signal to control the digitally trimmed crystal oscillator 112, a pullup enable signal (PULLUP) to control the weak XO pullup MOSFET 108, a digital output enable (DOUT) signal to enable reads of the calibration trim shift register 120 by enabling the tristate inverter 110, a digital clock (DCLK) to force data shifting within the calibration trim shift register 120, and an analog output enable (AOUT) signal to allow analog voltages from the digitally trimmed crystal oscillator to be forced to the crystal oscillator output (XO) pin 103.

Figure 4:
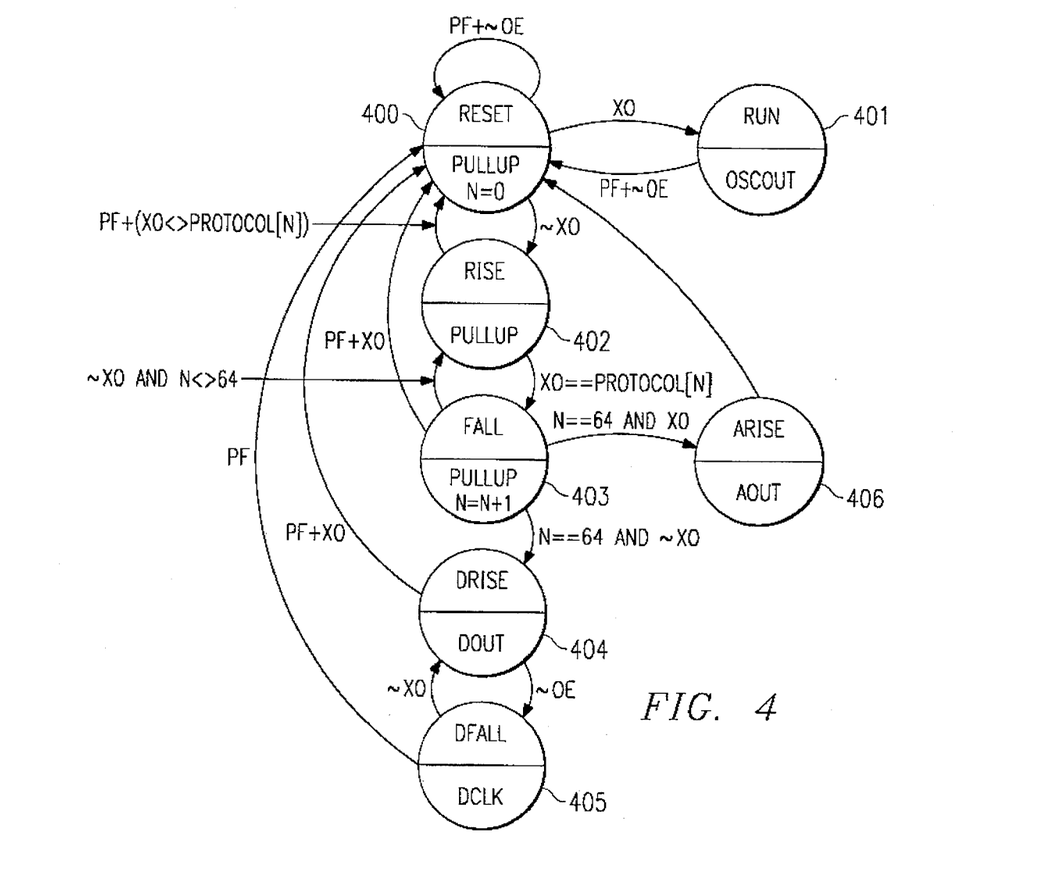
FIG. 4 illustrates a standard Moore machine state diagram of the functionality of the finite state machine of the present invention.

The various states present within the finite state machine 107 will now be explained in detail. FIG. 4 illustrates the various states supported within the finite state machine 107. Within the context of this discussion, the active edge of the OE signal is defined as the edge which would normally activate the XO crystal output signal in an industry standard crystal oscillator. This would be a rising edge for the output enable signal OE and a falling edge for the standby signal SB. Conversely, the inactive edge of the OE signal is defined as the edge which would normally deactivate the XO crystal output signal in an industry standard crystal oscillator. This would be a falling edge for the output enable signal OE and a rising edge for the standby signal SB.

The RESET state 400 is entered upon power fail detection or during any inactive edge of the OE signal. This state represents normal inactivity in a conventional prepackaged crystal oscillator. During this state the PULLUP signal is asserted to enable the weak MOSFET pullup device 108. In addition, the protocol index counter N is reset to zero. To ensure that no inadvertent modification of the calibration trim shift register 120 is performed, the current embodiment requires that a predefined serial communications match pattern (PROTOCOL) comprising a fixed bit stream must be transferred via a predefined method prior to allowing access to the calibration trim shift register.

In the current embodiment the protocol is fixed at 64 bits and has the fixed data pattern 5CA33AC55CA33AC5 hexadecimal. It is contemplated to be within the scope of this invention to use different protocol lengths and patterns depending on the specific application. For example, it would be possible to use different protocol lengths and fixed match patterns to allow communication with several different invention embodiments that were connected to the same XO crystal output signal.

Referring to FIG. 4, the RUN state 401 is entered if the XO pin is detected to be logically high on the active edge of OE. During this state the OSCENA signal is asserted to enable the digitally trimmed crystal oscillator 112 and the tristate output driver 109. The RUN state corresponds to the normal operation of an industry standard prepackaged crystal oscillator when the OE input is active and the XO pin emits the desired crystal oscillator clock frequency. The signal conditions during this state are illustrated as normal crystal oscillator operation 501 in FIG. 5.

The RISE state 402 is entered if the XO pin is detected to be logically low on the active edge of OE. This state represents a transition from the industry standard mode of crystal oscillator operation to a new mode in which serial communication with the crystal oscillator is possible. During this state the PULLUP signal remains asserted. Transition to the FALL state 403 occurs only if on the inactive edge of OE the state of the XO pin is logically equivalent to the current protocol bit PROTOCOL[N]. If the logic level of the XO pin is logically different from the current protocol bit PROTOCOL [N] on the inactive edge of OE, then the RESET state 400 is reentered. This state transition constitutes a protocol mismatch condition.

During the FALL state 403 the PULLUP signal remains asserted and the protocol bit index N is incremented. If the protocol bit index N has not yet reached the protocol length (64 in this embodiment), the state machine will enter the RESET state 400 if the next active edge of OE occurs with XO at VCC potential. Otherwise, the RISE state 402 will be entered if XO is inactive and the protocol has not yet been matched. If the protocol has been matched, as signified by the equivalence condition N==64, then the analog read ARISE state 406 will be entered if XO is active and the digital read/write DRISE state 404 will be entered if XO is inactive.

- The signal conditions during the analog read protocol used in the ARISE state 406 are illustrated in diagram 503 of FIG. 5. During the analog read ARISE state 406 the PULLUP signal is inhibited and the AOUT signal is asserted, thus enabling the output of analog buffer 111.

The tristate control of analog buffer 111 is traditionally accomplished via the use of a MOSFET transmission gate. It is contemplated that a variety of methods to accomplish this analog switching functionality can be used.

The analog buffer 111 forces the selected analog output voltage emitted by the digitally trimmed crystal oscillator 112 to be emitted at the XO output pad 103. This voltage remains at the output pad until the next state machine clock, at which time the RESET state 400 is entered.

The signal conditions during the digital read/write protocol used in the DRISE state 404 are illustrated in the read/write digital protocol 502 of FIG. 5. During the digital read/write DRISE state 404 the PULLUP signal is asserted to provide a weak pullup to VCC on XO and the DOUT signal is asserted to enable tristate buffer 110. On the inactive edge of OE the DFALL state 405 is entered at which time the DCLK signal is activated to clock the calibration trim shift register 120. During the time the DRISE state 404 is active the XO pin 103 may be actively driven to the VCC or GND potentials externally to force the data value shifted into the calibration trim shift register 120 on the subsequent transition to the DFALL state 405.

When the DFALL state 405 is entered a digital clock DCLK is generated to force shifting of the calibration trim shift register 120. If on the next active edge of OE the XO pin is inactive, then the DRISE state 404 is reentered in preparation for another input to the calibration trim shift register 120. Otherwise, a transition to the RESET state 400 is performed on the next active edge of OE.

Analog Buffer

Referring again to FIG. 1, the calibration trim shift register 120 feeds parallel data into the digitally trimmed crystal oscillator 112. Several of the bits of this parallel data stream may be used to select from a plurality of analog test points within the digitally trimmed crystal oscillator using a conventional analog multiplexer. The output of this multiplexing process is used as the input to an analog buffer 111 which can selectively drive this analog information out to the XO bond pad 103 under control of the state machine 107 AOUT signal. It is understood that there are a variety of methods to implement the analog buffer 111, including but not limited to conventional operational amplifiers (OPAMPs), operational transconductance amplifiers (OTAs), or CMOS inverters with resistive feedback used as simple inverting amplifiers.

The primary considerations when selecting a particular circuit implementation for the analog buffer 111 are power consumption and total circuit complexity which translates directly into consumed integrated circuit silicon area. Depending on the application, a wide spectrum of solutions are appropriate.

CONCLUSION

Although a preferred embodiment of the present invention has been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A communication system which can provide read and write access to analog and digitally controlled calibration and configuration information contained within prepackaged crystal oscillators, comprising:

a plurality of electrical connections including,
   a power (VCC) connection,
   a ground (GND) connection,
   an output enable (OE) connection for receiving an output enable (OE) signal,
   a crystal oscillator output (XO) connection;

a power fail detector having a VCC input and a PF output, said VCC input connected to said VCC connection, said PF output conditioned by said power fail detector with said PF output having a first output equal to ground potential when said VCC input falls below a predefined power supply threshold voltage, and a second output equal to the potential at said VCC input when said VCC input is at least equal to said predefined power supply threshold voltage;

a clock generator having an OE input and a CLK output, said OE input connected to said OE connection, said clock generator emitting one pulse at said CLK output responsive to each rising and falling edge said OE signal received at said OE input from said OE connection;

a finite state machine having PF, OE, CLK, and XO inputs, OSCENA, PULLUP, DOUT, DCLK, and AOUT outputs, a fixed internal PROTOCOL match register of arbitrary length M bits, and an internal binary counter N having a maximum count of M, said XO input connected to said XO connection, said PF input connected to said power fail PF output, said CLK input connected to said clock generator CLK output, and said OE input connected to said OE connection;

said state machine including a plurality of states, including, a RESET state activated on the activation of said PF input or the deassertion of said OE input, said RESET state asserting said PULLUP input and setting said counter N to zero, a RUN state activated on the assertion of said XO input when the previous state was said RESET state, said RUN state asserting said OSCENA output, said RUN state transitioning to said RESET state on the assertion of said PF input or the deassertion of said OE input, a RISE state activated on the deassertion of said XO input when the previous state was said RESET state, said RISE state asserting said PULLUP output, said RISE state transitioning to said RESET state on the assertion of said PF input or the mismatch of said XO input and the current state of said PROTOCOL bit indexed by counter N, a FALL state activated on the assertion of said XO input matching the logic state of said PROTOCOL register bit indexed by counter N when the previous state was said RISE state, said FALL state asserting said PULLUP output and simultaneously incrementing said counter N, said FALL state transitioning to said RISE state on the deassertion of said XO input when said counter N is less than M, said FALL state transitioning to said RESET state on the assertion of said PF input or the assertion of said XO input, a DRISE state activated when said counter N reaches M and said XO input is deasserted when the previous state was said FALL state, said DRISE state asserting said DOUT output, said DRISE state transitioning to said RESET state on the assertion of said PF input or said XO input, a DFALL state activated on the deassertion of said OE input when the previous state was said DRISE state, said DFALL state asserting said DCLK output, said DFALL state transitioning to said RESET state on the assertion of said PF input, said DFALL state transitioning to said DRISE state on the deassertion of said XO input, and an ARISE state activated on the assertion of XO when said counter N is equal to M and the previous state was said FALL state, said ARISE state asserting said AOUT output, said ARISE state transitioning to said RESET state unconditionally on the next active transition of said CLK input;

a pullup device having control gate input, said pullup device connecting said VCC connection and said XO connection, said control gate input being connected to said state machine PULLUP output;

a calibration trim shift register including a C clock input, a plurality of D inputs and a plurality of corresponding Q outputs, said shift register being capable of shifting digital data from said D inputs to said Q outputs upon reception of each rising edge of said C clock input;

an analog buffer having PLUS, MINUS, and G inputs and a single output OUT, said analog buffer being configured in a unity gain configuration such that output OUT is connected to input MINUS, said output OUT being connected to said XO connection and said G input being connected to said AOUT state machine output, said analog buffer being activated when said G input is at VCC potential;

a weak tristate inverter having digital and weak tristate enable inputs and a tristate output, said weak inverter connecting the last flip-flop of said calibration trim shift register with said XO bond pad, said weak tristate enable being connected to said DOUT state machine output; and a strong tristate inverter having digital and strong tristate enable inputs and a tristate output, said strong inverter connecting the XO output of said digitally trimmed crystal oscillator and said XO connection, said strong tristate enable being connected to said OSCENA state machine output.

2. The communication system of claim 1, wherein said pullup device is a MOSFET transistor.

3. The communication system of claim 1, wherein said state machine matches 64 protocol bits having value 5CA33AC55CA33AC5 hexadecimal, said state machine having a said maximum count M of 64 to accommodate this protocol length.

4. The communication system of claim 1, wherein said communication system is encased in a steel enclosure having an industry standard 8-pin 300 mil DIP crystal oscillator pinout, said enclosure having interpin dimensions of 0.3 inches from pins 1/4 to pins 8/5 and 0.3 inches from pins 1/8 to pins 4/5.

5. The communication system of claim 1, wherein said communication system is encased in a steel enclosure having an industry standard 14-pin 300 mil DIP crystal oscillator pinout, said enclosure having inter-pin dimensions of 0.3 inches from pins 1/7 to pins 14/8 and 0.3 inches from pins 1/14 to pins 7/8.

6. The communication system if claim 1, wherein said communication system is encapsulated in an epoxy resin.

7. The communication system of claim 1, wherein said communication system is used to calibrate said digitally trimmed crystal oscillator.

8. A device for calibrating and configuring a prepackaged crystal oscillator, comprising:

means for storing calibration and configuration information of a digitally trimmed crystal oscillator;

means for assessing varying conditions of the crystal oscillator;

means for accessing specific calibration and configuration information from said storing means corresponding to a specific assessed condition of the crystal oscillator; and means for performing calibration and configuration on the crystal oscillator using said specific calibration and configuration information.

9. The device of claim 8, further comprising:

means for controlling the operating modes of the prepackaged crystal oscillator.

10. The device of claim 9, wherein:

said controlling means includes a state machine.

11. The device of claim 10, wherein:

said storing means includes a calibration trim shift register.

12. The device as recited in claim 11, further comprising:

means for providing external electrical interfacing.

13. The device of claim 12, wherein:

said interfacing means includes a plurality of electrical connections including,
- a power (VCC) connection;
- a ground (GND) connection;
- an output enable (OE) connection for receiving an OE signal; and
- a crystal oscillator output (XO) connection.

14. The device of claim 13, wherein:

said controlling means includes a power fail detector, said detector includes a VCC input and a PF output, said VCC input connected to said VCC connection;

said PF output conditioned by said power fail detector with said PF output having a first output equal to ground potential when said VCC input falls below a predefined power supply threshold voltage, and a second output equal to the potential at said VCC input when said VCC input is at least equal to said predefined power supply threshold voltage.

15. The device of claim 14, wherein:

said controlling means includes a clock generator, said clock generator includes an OE input and a CLK output, said OE input connected to said OE connection;

said clock generator emitting one pulse at said CLK output responsive to each rising and falling edge of said OE signal received at said OE input from said OE connection.

16. The device of claim 15, wherein:

said state machine includes PF, OE, CLK, and XO inputs, OSCENA, PULLUP, DCLK, and AOUT outputs, a fixed internal PROTOCOL match register of arbitrary length M bits, and an internal binary counter N having a maximum count of M;

said XO input connected to said XO connection, said PF input connected to said power fail PF output, said CLK input connected to said clock generator CLK output, and said OE input connected to said OE connection.

17. The device of claim 16, wherein:

said state machine includes a plurality of operating states.

18. The device of claim 17, wherein:

said plurality of operating states includes a RESET state;

said RESET state activated on the activation of said PF input or the deassertion of said OE input; and said RESET state asserting said PULLUP input and setting said counter N to zero.

19. The device of claim 18, wherein:

said plurality of operating states includes a RUN state;

said RUN state activated on the assertion of said XO input when the previous state was said RESET state;

said RUN state asserting said OSCENA output, and transitioning to said RESET state on the assertion of said PF input or the deassertion of said OE input.

20. The device of claim 19, wherein:

said plurality of operating states includes a RISE state;

said RISE state activated on the deassertion of said XO input when the previous state was said RESET state;

said RISE state asserting said PULLUP output; and said RISE state transitioning to said RESET state on the assertion of said PF input or the mismatch of said XO input and the current state of said PROTOCOL bit indexed by counter N.

21. The device of claim 20, wherein:

said plurality of operating states includes a FALL state;

said FALL state activated on the assertion of said XO input matching the logic state of said PROTOCOL register bit indexed by counter N when the previous state was said RISE state;

said FALL state asserting said PULLUP output and simultaneously incrementing said counter N;

said FALL state transitioning to said RISE state on the deassertion of said XO input when said counter N is less than M; and said FALL state transitioning to said RESET state on the assertion of said PF input or the assertion of said XO input.

22. The device of claim 21, wherein:

said plurality of operating states includes a DRISE state activated when said counter N reaches M and said XO input is deasserted when the previous state was said FALL state;

said DRISE state asserting said DOUT output; and said DRISE state transitioning to said RESET state on the assertion of said PF input or said XO input.

23. The device of claim 22, wherein:

said plurality of states includes a DFALL state activated on the deassertion of said OE input when the previous state was said DRISE state;

said DFALL state asserting said DCLK output;

said DFALL state transitioning to said RESET state on the assertion of said PF input; and said DFALL state transitioning to said DRISE state on the deassertion of said XO input.

24. The device of claim 23, wherein:

said plurality of states includes an ARISE state activated on the assertion of XO when said counter N is equal to M and the previous state was said FALL state;

said ARISE state asserting said AOUT output; and said ARISE state transitioning to said RESET state unconditionally on the next active transition of said CLK input.

25. The device of claim 16, wherein:

said interfacing means includes a pullup device having control gate input, said pullup device connecting said VCC connection and said XO connection, said control gate input being connected to said state machine PULLUP output.

26. The device of claim 11, wherein:

said calibration trim shift register includes a C clock input, a plurality of D inputs and a plurality of corresponding Q outputs, said shift register being capable of shifting digital data from said D inputs to said Q outputs upon reception of each rising edge of said C clock input.

27. The device of claim 16, wherein:

said interfacing means includes an analog buffer having PLUS, MINUS, and G inputs and a single output OUT, said analog buffer being configured in a unity gain configuration such that output OUT is connected to input MINUS;

said output OUT being connected to said XO connection and said G input being connected to said AOUT state machine output, said analog buffer being activated when said G input is at VCC potential.

28. The device of claim 12, wherein:

said assessing means includes analog voltages emitted from the crystal oscillator to said interfacing means.

29. The device of claim 16, wherein:

said calibration and configuration performing means includes a weak tristate inverter having digital and weak tristate enable inputs and a tristate output, said weak inverter connecting the last flip-flop of said calibration trim shift register with said XO bond pad, said weak tristate enable being connected to said DOUT state machine output; and a strong tristate inverter having digital and strong tristate enable inputs and a tristate output, said strong inverter connecting the XO output of said digitally trimmed crystal oscillator and said XO connection, said strong tristate enable being connected to said OSCENA state machine output.

30. The device of claim 8, wherein:

said calibration and configuration information includes oscillator frequency trim information, serial number information, calibration traceability information, and date of manufacture information.

31. The device of claim 8, wherein:

said storing means includes a non-volatile memory element.

32. The device of claim 31, wherein:

said memory element is a RAM, EPROM or EEPROM.

33. A method of calibrating and configuring a prepackaged crystal oscillator, comprising the steps of:

testing the output of a prepackaged crystal oscillator through a range of varying temperatures;

calculating the amount of compensation needed for the oscillation frequency of the crystal at the various temperatures;

calculating the calibration information corresponding to the compensation needed for the crystal over the entire temperature range;

storing the calibration information in a calibration trim shift register;

accessing specific calibration information corresponding to a specific operating temperature from the calibration trim shift register; and changing the digital trimming of the crystal oscillator corresponding to the specific calibration information.

34. A device for calibrating and configuring a plurality of interconnected prepackaged crystal oscillators, comprising:

means for storing calibration and configuration information of a plurality of digitally trimmed crystal oscillators;

means for assessing varying conditions of each of the plurality of crystal oscillators;

means for accessing specific calibration and configuration information from said storing means corresponding to a specific assessed condition of each of the plurality of crystal oscillators; and means for performing calibration and configuration on each of the plurality of crystal oscillators using said specific calibration and configuration information.

35. The device of claim 34, further comprising:

means for preventing inadvertent modification of said calibration and configuration information stored in said storing means.

36. The device of claim 35, wherein:

said preventing means includes a predefined serial communications match pattern.

37. The device of claim 35, wherein:

said preventing means includes at least two different predefined serial communications match patterns.

* * * * *

UNITED STATES PATENT AND TRADEMARK OFFICE
CERTIFICATE OF CORRECTION

PATENT NO. : 5,543,761
DATED : Aug. 6, 1996
INVENTOR(S) : Klughart

It is certified that error appears in the above-indentified patent and that said Letters Patent is hereby corrected as shown below:

Column 6, line 58      Replace "0E"
With --OE--

Column 6, line 67      Replace "0E"
With --OE--

Column 7, line 42      Replace "iS"
With --is--

Column 8, line 48      Replace "0E"
With --OE--

Column 8, line 65      Replace "register."
With --register 120.--

Column 11, line 5      Replace "0E"
With --OE--

Signed and Sealed this

Twenty-third Day of December, 1997

Attest:

BRUCE LEHMAN

*Attesting Officer*      Commissioner of Patents and Trademarks